(12) United States Patent
Iguchi et al.

(10) Patent No.: US 7,477,122 B2
(45) Date of Patent: Jan. 13, 2009

(54) LOOP TYPE COIL PARTS

(75) Inventors: Koichi Iguchi, Gunma (JP); Takanori Yoshizawa, Gunma (JP); Hideharu Suzuki, Gunma (JP); Takahiro Samata, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 57 days.

(21) Appl. No.: 11/703,562

(22) Filed: Feb. 7, 2007

(65) Prior Publication Data
US 2007/0188281 A1 Aug. 16, 2007

(30) Foreign Application Priority Data
Feb. 8, 2006 (JP) .............................. 2006-061812

(51) Int. Cl.
*H01F 27/29* (2006.01)
(52) U.S. Cl. ...................................... 336/192
(58) Field of Classification Search ................... 336/65, 336/83, 192, 200, 232
See application file for complete search history.

(56) References Cited

U.S. PATENT DOCUMENTS

| | | | | |
|---|---|---|---|---|
| 4,777,461 A | * | 10/1988 | Sakamoto | 333/184 |
| 5,357,226 A | * | 10/1994 | Azuma | 333/172 |
| 6,154,112 A | * | 11/2000 | Aoba et al. | 336/192 |
| 6,427,315 B1 | * | 8/2002 | Kitagawa et al. | 29/602.1 |
| 6,552,642 B1 | * | 4/2003 | Toi et al. | 336/192 |
| 2005/0212643 A1 | * | 9/2005 | Kuroiwa et al. | 336/200 |
| 2006/0267719 A1 | | 11/2006 | Yasuda et al. | |

FOREIGN PATENT DOCUMENTS

| | | | |
|---|---|---|---|
| EP | 1103993 A1 | | 5/2001 |
| JP | 3-83909 | | 8/1991 |
| JP | 7-115023 | | 2/1995 |
| JP | 07302719 A | * | 11/1995 |

* cited by examiner

*Primary Examiner*—Tuyen T. Nguyen
(74) *Attorney, Agent, or Firm*—Knobbe Martens Olson & Bear

(57) ABSTRACT

One inventive aspect relates to a low back type loop type coil part which may facilitate confirmation of quality of soldering. The loop type coil part comprises a core including a spool arranged vertically to a mounting side and a plate-like flange provided at an end of the spool to come in contact with the mounting side. A coil lead is wound around the spool, and an end of the coil lead is soldered and fixed to a terminal electrode of a bottom surface of the flange. A protruding part is provided at a part of a side surface of the flange in a length direction. A recess is formed in the bottom surface of the flange so as to be in contact with the protruding part of the side surface and a non-protruding part adjacent to the protruding part. The terminal electrode is provided to be continuous across an inner wall surface of the recess, a bottom surface of the protruding part, and a bottom surface of the non-protruding part. Accordingly, by using the protruding size of the flange, the fillet to facilitate confirmation of quality of soldering can be formed without increasing the thickness size of the flange of the core and the height size of the core.

4 Claims, 5 Drawing Sheets

PRIOR ART

LOOP TYPE COIL PARTS

BACKGROUND OF THE INVENTION

1. Field of the Invention

The present invention relates to loop type coil parts used for various thin electrical instruments.

2. Description of the Related Technology

Loop type coil parts, such as an inductor, a transformer and a common mode choking coil, used for various electrical instruments are generally such that a coil lead is wound around a spool of a drum type core, and an end of the coil lead is soldered to a terminal electrode provided on a bottom surface of a flange which is in contact with a mounting side. Specifically, as disclosed in JP-UM-A-3-083909 (FIG. 7), there is known a surface mount coil part 1 in which a groove 5 is provided in a bottom surface of a flange 4 of a drum type core which is in contact with a mounting side of a circuit board, terminal electrodes 6 are provided at both sides of the groove of the bottom surface, an end 2a of a coil lead 2 wound around a spool of the drum type core is inserted in the groove 5 and is soldered to the terminal electrodes 6 of the bottom surface. As shown in FIG. 8, the coil part 1 as stated above is mounted on a land electrode 7a previously printed with a solder paste on the mounting side of a circuit board 7, and is solder mounted by reflow soldering or the like. At this time, the size of a fillet 5 formed between the land electrode 7a of the circuit board 7 and the terminal electrode 6 of the coil part 1 is observed using an automatic visual-inspection equipment or the like, so that confirmation of quality of a soldering state between the terminal electrode 6 of the coil part 1 and the land electrode 7a of the circuit board 7 is performed. Although not shown in the drawings, JP-A-7-115023 proposes a coil part in which in order to facilitate the inspection of soldering properties by using the fillet, a groove is provided in the bottom surface of a flange of a drum type core which is in contact with the mounting side of a circuit board, an electrode continuous with an inner wall of the groove, a bottom surface adjacent thereto, and a side surface of the flange in contact with the bottom surface is provided, and the fillet is formed on the side surface.

In recent years, there is increasing a tendency that thin electrical instruments are used in consideration of space-saving and portability, and thin coil parts used for these electrical instruments are desired. However, in the surface mount coil part of the related art disclosed in JP-UM-A-3-083909, since only the fillet corresponding to the sectional area of the groove of the flange is formed, in order to obtain a large fillet, the thickness of the flange of the drum type core is made thick and a deep and large groove must be provided, and the height size of the coil part becomes high by that, and accordingly, it has been difficult to obtain a low back type coil. Besides, when the thickness size of the flange is made small in order to obtain the low back type coil part, it has been difficult to provide an electrode for fillet confirmation with a sufficient area on the side surface of the flange like the coil part of the structure disclosed in JP-A-7-115023.

SUMMARY OF CERTAIN INVENTIVE ASPECTS

Certain inventive aspects provide a low back type loop type coil part in which a fillet to facilitate confirmation of quality of soldering can be formed.

In a loop type coil part in which a core includes a spool arranged vertically to a mounting side and a flange, which can be plate like, provided at an end of the spool to come in contact with the mounting side, a coil lead is wound around the spool, and an end of the coil lead is soldered and fixed to a terminal electrode provided on a bottom surface of the flange, a protruding part is provided at a part of a side surface of the flange in a length direction, a recess is formed in the bottom surface of the flange to be in contact with the protruding part of the side surface of the flange and a non-protruding part adjacent to the protruding part, and the terminal electrode is provided to be continuous across an inner wall surface of the recess adjacent to at least the side surface, a bottom surface of the protruding part, and a bottom surface of the non-protruding part.

According to an aspect of the invention, the protruding part is provided at the center of the side surface of the flange in the length direction, and the terminal electrode is provided from the bottom surface of the protruding part of the flange to the bottom surface of the non-protruding part at each of both sides thereof.

According to another aspect of the invention, a protruding size of the protruding part of the side surface of the flange from the non-protruding part is larger than a depth size of the recess of the flange.

According to another aspect of the invention, a protruding size of the protruding part of the side surface of the flange from the non-protruding part is larger than a diameter of a wire rod of the coil lead.

In the loop type coil part in which the core includes the spool arranged vertically to the mounting side and the plate-like flange provided at the end of the spool to come in contact with the mounting side, the coil lead may be wound around the spool, and the end of the coil lead is soldered and fixed to the terminal electrode provided on the bottom surface of the flange, the protruding part is provided at the part of the side surface of the flange in the length direction, the recess is formed in the bottom surface of the flange to be in contact with the protruding part of the side surface of the flange and the non-protruding part adjacent to the protruding part, and the terminal electrode is provided to be continuous across the inner wall surface of the recess adjacent to at least the side surface, the bottom surface of the protruding part, and the bottom surface of the non-protruding part.

Thus, an upper edge part of a fillet may be formed along the inner wall surface of the recess from the protruding part of the side surface of the flange to the non-protruding part of the side surface, a lower edge part of the fillet is formed to connect a corner part of the terminal electrode of the bottom surface of the protruding part of the flange and a corner part of the terminal electrode of the bottom surface of the non-protruding part along an outer periphery of a land electrode of the mounting side of a circuit board, and the fillet is formed in which an oblique surface surrounded by the upper edge part and the lower edge part is a visual check surface.

Accordingly, by using the protruding size of the flange, the fillet to facilitate the confirmation of quality of soldering can be formed without increasing the thickness size of the flange of the core and the height size of the core.

The above object and other objects, structural features, and operation and effect of these inventive aspects will become apparent by the following description and the attached drawings.

DETAILED DESCRIPTION OF CERTAIN EMBODIMENTS

Figure 1:
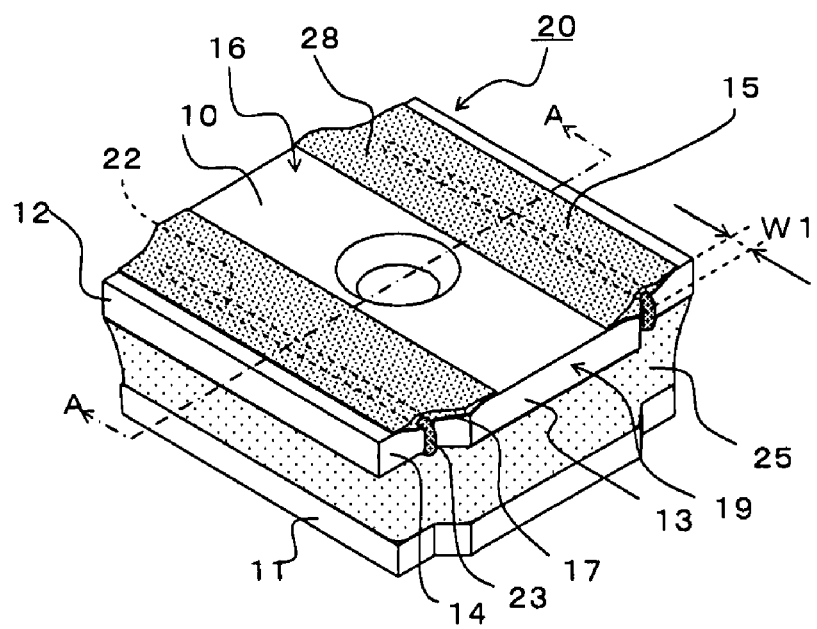
FIG. 1 is an outer appearance perspective view showing the whole loop type coil part of a first embodiment of the invention.

Various aspects and features of the invention will become more fully apparent from the following description and appended claims taken in conjunction with the foregoing drawings. In the drawings, like reference numerals indicate identical or functionally similar elements. In the following description, specific details are given to provide a thorough understanding of the disclosed methods and apparatus. However, it will be understood by one of ordinary skill in the technology that the disclosed systems and methods may be practiced without these specific details. For example, electrical components mat be shown in block diagrams in order not to obscure certain aspects in unnecessary detail. In other instances, such components, other structures and techniques may be shown in detail to further explain certain aspects.

Figure 2:
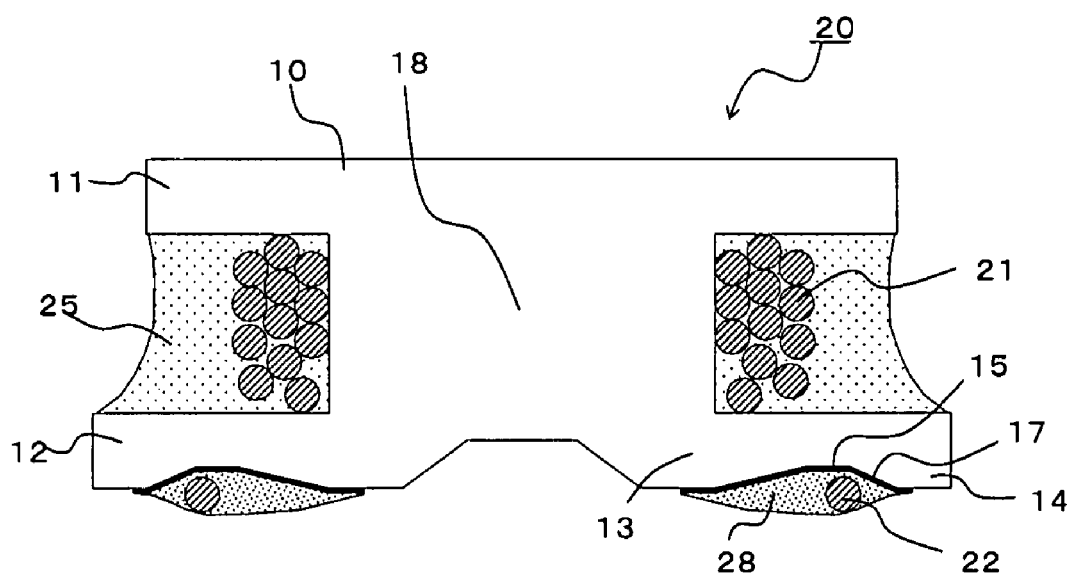
FIG. 2 is a sectional view taken along line A-A of FIG. 1 and showing an inner structure of the loop type coil part of the first embodiment.
Figure 3:
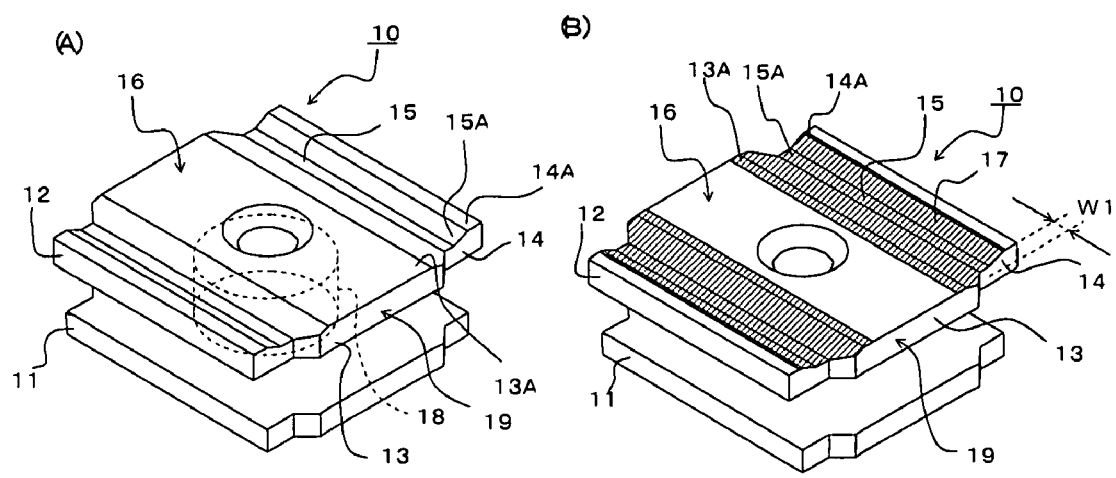
FIGS. 3A and 3B are outer appearance perspective views for explaining a drum type core used for the loop type coil part of the first embodiment.
Figure 4:
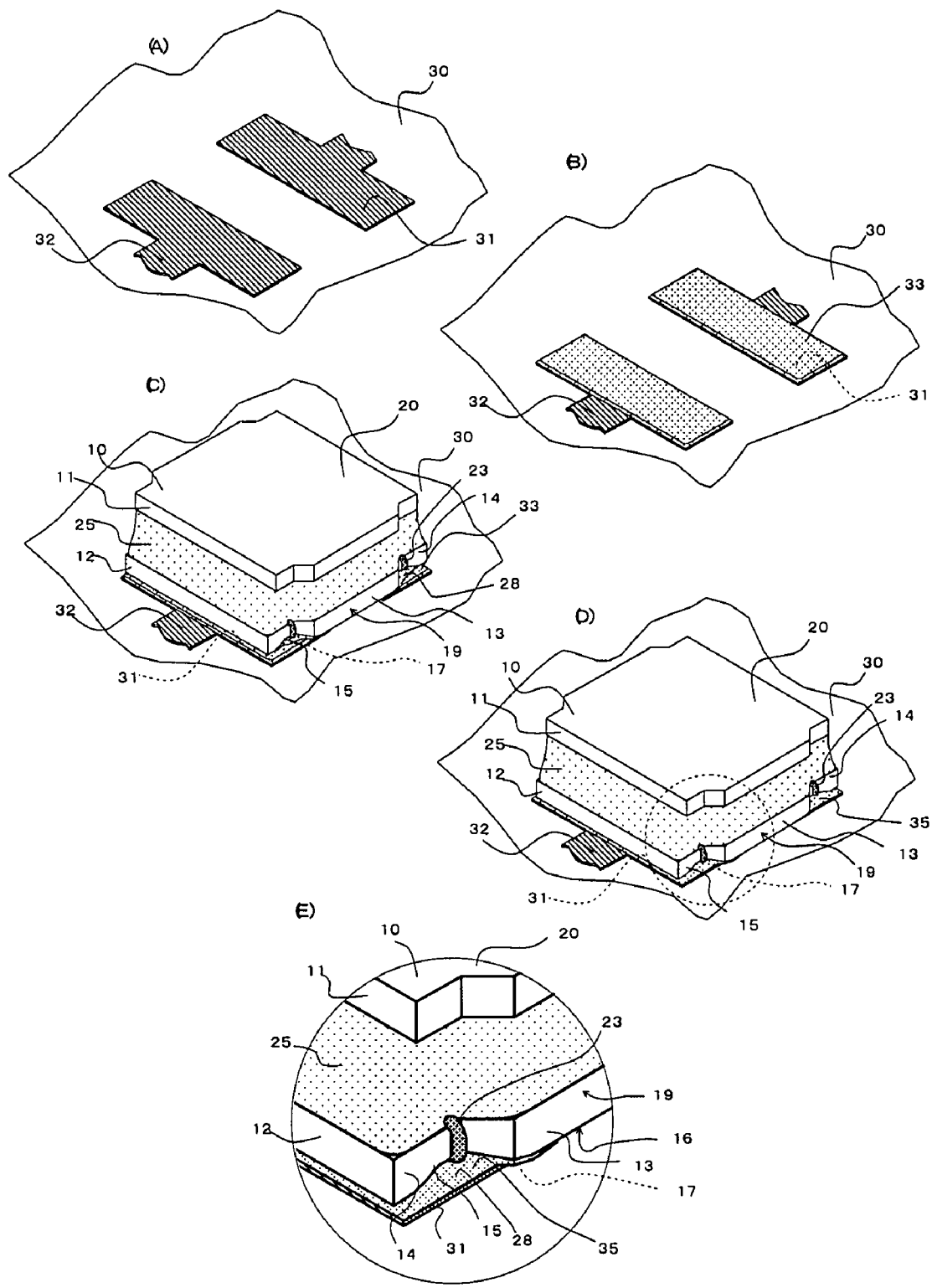
FIGS. 4A to 4E are outer appearance perspective views for explaining steps of solder mounting the loop type coil part of the first embodiment onto a circuit board.

Hereinafter, a first embodiment of a loop type coil part will be described with reference to FIG. 1 to FIG. 4. FIG. 1 is an outer appearance perspective view of the loop type coil part of the first embodiment seen from a side which comes in contact with a mounting side of a circuit board. FIG. 2 is a sectional view taken along line A-A of FIG. 1 of the first embodiment. FIGS. 3A and 3B are perspective views showing a core used for the loop type coil part of the first embodiment, in which FIG. 3A is an outer appearance perspective view of the core, and FIG. 3B is an outer appearance perspective view of a state where a terminal electrode is provided on the core. FIGS. 4A to 4E are partial enlarged perspective views for explaining steps of solder mounting the loop type coil part of this embodiment onto a land electrode of the mounting side of the circuit board, in which FIG. 4A is a view showing the land electrode of the circuit board, FIG. 4B is a view showing a state where a solder paste is applied on the land electrode, FIG. 4C is a view showing a state where the loop type coil part of the embodiment is mounted on the land electrode, FIG. 4D is a view showing a state where the land electrode and the loop type coil part are reflow soldered, and FIG. 4E is a view showing a state where a range surrounded by a broken line in FIG. 4D is further enlarged.

As shown in FIG. 1 to FIG. 3, a loop type coil part 20 of this embodiment is the loop type coil part 20 in which a drum type core 10 includes a spool 18 arranged vertically to a mounting side and a plate-like flange 12 provided at an end of the spool 18 to come in contact with the mounting side, a coil lead 21 is wound around the spool 18, and an end 22 of the coil lead 21 is soldered and fixed to a terminal electrode 17 provided on a bottom surface 16 of the flange 12, and in which a protruding part 13 is provided at a part of a side surface 19 of the flange 12 in a length direction, a recess 15 is formed in the bottom surface 16 of the flange 12 to be in contact with the protruding part 13 of the side surface 19 of the flange 12 and a non-protruding part 14 adjacent to the protruding part 13, and the terminal electrode 17 is provided to be continuous across an inner wall surface 15A of the recess 15 adjacent to at least the side surface 19, a bottom surface 13A of the protruding part 13, and a bottom surface 14A of the non-protruding part 14.

Further, in the loop type coil part 20 of the embodiment, an outer periphery of the coil lead 21 wound around the spool 18 of the drum type core 10 is coated with an exterior resin 25 containing magnetic powder.

Besides, in the loop type coil part 20 of the first embodiment, the protruding part 13 is provided at the center of the side surface 19 of the flange 12 in the length direction, and the terminal electrode 17 is provided from the bottom surface 13A of the protruding part 13 of the flange 12 to the bottom surface 14A of the non-protruding part 14 at each of both sides thereof.

Besides, in the loop type coil part 20 of the first embodiment, a protruding size W1 of the protruding part 13 of the side surface 19 of the flange 12 from the non-protruding part 14 is larger than a depth size of the recess 15 of the flange 12.

Besides, in the loop type coil part 20 of the first embodiment, the protruding size W1 of the protruding part 13 of the side surface 19 of the flange 12 from the non-protruding part 14 is larger than a diameter of a wire rod of the coil lead 21.

Next, a process of solder mounting the loop type coil part to a circuit board will be described with reference to FIGS. 4A to 4E.

First, as shown in FIG. 4A, onto a land electrode 31 connected to a wiring pattern 32 of a main surface of a circuit board 30, as shown in FIG. 4B, a solder paste 33 is applied by stencil print using a metal mask, and next, as shown in FIG. 4C, the loop type coil part 20 is mounted by using an electronic chip components mounted device or the like so that the terminal electrode 17 of the loop type coil part 20 overlaps with the land electrode to which the solder paste 33 has been applied. Next, the circuit board 30 on which the loop type coil part 20 is mounted is heated through a not-shown reflow soldering furnace, the solder paste 33 is melted and solidified, and as shown in FIG. 4D, the terminal electrode 17 of the loop type coil part 20 and the land electrode 31 of the circuit board 30 are conductively connected to each other. At this time, as shown in FIG. 4E, by the solder to conductively connect the terminal electrode 17 of the loop type coil part 20 and the land electrode 31 of the circuit board 30, an upper edge part of a fillet 35 is formed along the inner wall surface of the recess 15 from the protruding part 13 of the side surface 19 of the flange 12 of the loop type coil part 20 to the non-protruding part 14 of the side surface 19, a lower edge part of the fillet 35 is formed so as to connect a corner part of the terminal electrode 17 of the bottom surface of the protruding part 13 of the flange 12 and a corner part of the terminal electrode 17 of the bottom surface of the non-protruding part 14 along an outer periphery of the land electrode 31 of the mounting side of the circuit board 30, and the fillet 35 having a wide area and excellent visibility is formed in an area surrounded by the upper edge part and the lower edge part.

Accordingly, by using the protruding size W1 of the flange 12, the fillet 35 to facilitate the confirmation of quality of soldering can be formed without increasing the thickness size of the flange 12 of the drum type core 10 and the height size of the core 10.

As the core 10 of the loop type coil part 20, from various ceramic materials, such as high permeability insulating material containing Ni—Zn ferrite or Ni—Zn—Cu ferrite as its main ingredient, or non-magnetic insulating material such as alumina, a suitable one can be suitably selected and used according to the usage of the loop type coil part. Powder of the insulating material and a binder are mixed and granulated, and then are molded into a specified shape by using a powdery moulding press, and after debinding processing is performed at about 800° C., firing at a specified temperature is performed according to sintering temperature of each insulating material, and the core is obtained. Besides, the core 10 is not limited to the ceramic insulator as stated above, and the resin composite drum type core 10 can also be used which can be obtained by mixing powder of the high permeability insulating material, powder of low resistance magnetic material such as Mn—Zn ferrite or metal magnetic material, or powder of the non-magnetic insulating material with insulating resin such as epoxy resin and by performing molding in a metal mold of a specified shape.

The shape of the core is generally the drum type in which at each of both ends of a spool around which a coil lead is wound, a flat-shaped flange is formed integrally with the spool or separately therefrom. However, the invention is not limited to this, and the upper flange may be omitted, or may be modified to have another shape, specifically, a cap type or the like. Besides, the drum type core may be formed by combining the ceramic insulator and the resin composite.

As the terminal electrode 17 provided on the bottom surface of the flange of the core 10, in the case of the core using the ceramic insulator, a baking type electrode material paste containing AG powder and glass powder can be used. However, the invention is not limited to this, and a thermosetting conductive paste in which a conductive particle such as Ag powder or Ag—Pd powder and epoxy resin are mixed can be used. Besides, in the case of the latter thermosetting conductive paste, it can also be applied as the terminal electrode of the core using the resin composite.

Besides, in order to improve soldering properties, Ni plating, Sn plating or the like may be formed on the surface of the terminal electrode 17 as the need arises.

As the protruding part 13 provided at a part of the side surface 19 of the flange 12 of the drum type core 10 in the length direction, it is preferable that the protruding part is provided at the center of the side surface 19 of the flange 12 in the length direction, and the terminal electrode 15 is provided from the bottom surface 13A of the protruding part 13 of the flange 12 to the bottom surface 14A of the non-protruding part 14 at each of both sides thereof. According to this, since the fillet 35 is formed toward the direction of four corners of the flange 12, there is a merit that the confirmation of quality of solder connection from the outer periphery becomes easy.

Besides, it is preferable that the protruding size W of the protruding part 13 of the side surface 19 of the flange 12 from the non-protruding part 14 is made larger than the depth size of the recess of the flange 12. According to this, when solder mounting is performed on the land electrode 31 of the circuit board 30, the large area fillet 35 of a substantially triangular section having the protruding size W1 as a bottom side, at least the depth size of the recess as a height, and the visual check surface as an oblique side is formed without increasing the thickness size of the flange 12 and the depth size of the recess 15 of the bottom surface 16 of the flange 12, and therefore, there is a merit that the visibility is improved.

Besides, it is preferable that the protruding size W of the protruding part 13 of the side surface 19 of the flange 12 from the non-protruding part 14 is made larger than the diameter of the wire rod of the coil lead 21. According to this, when the solder mounting is performed on the land electrode 31 of the circuit board 30, the large area fillet 35 of a substantially triangular section having the protruding size W as a bottom side, at least the diameter of the wire rod of the coil lead 21 as a height, and the visual check surface as an oblique side is formed without increasing the height size of the drum type core 10 and the diameter of the wire rod of the coil lead 21, and therefore, there is a merit that the visibility is improved.

Next, an example of a manufacturing process of the loop type coil part 20 will be described. First, magnetic material powder containing Ni—Zn ferrite as its main ingredient, organic binder and solvent are mixed to prepare slurry, the obtained slurry is granulated by using a spray dryer, is molded into a specified shape by using a dry moulding press, and after the obtained mold is heated in the atmosphere at 800° C. for 30 minutes to perform debinding processing, firing is performed at 1300° C. for 3 hours, and the drum type core 10 is obtained which includes the spool 18 arranged vertically to the mounting side and the plate-like flange 12 provided at the end of the spool 18 to come in contact with the mounting side, and in which the protruding part 13 is provided at a part of the side surface 19 of the flange 12 in the length direction, and the recess 15 is formed in the bottom surface 16 of the flange 12 to be in contact with the protruding part 13 of the side surface 19 of the flange 12 and the non-protruding part 14 adjacent to the protruding part 13.

Next, a baking type electrode material paste containing Ag powder as its main ingredient is prepared, the electrode material paste is applied to the flange 12 at the side of the obtained core 10 in contact with the mounting side by a transfer method so as to be continuous across the inner wall surface 15A of the recess 15 adjacent to at least the side surface 19, the bottom surface 13A of the protruding part 13, and the bottom surface 14A of the non-protruding part 14, firing at 650° C. for 10 minutes is performed to form the terminal electrode 17, and further, Ni plating and Sn plating are sequentially formed on the surface of the terminal electrode 17 by electrolysis plating.

The coil lead 21 made of a polyurethane coated copper wire is wound around the spool 18 of the thus obtained core 10 arranged vertically to the mounting side, the end 22 of the coil lead 21 is previously dipped in a molten solder layer to peel off an insulating coating, and then the end is introduced into the recess 15 of the bottom surface 16 of the core 10 in which the terminal electrode 17 is formed, is heated at 240° C., and is fixed to the terminal electrode 17 by soldering.

Next, a thermosetting insulating resin paste containing ferrite powder is applied to the outer periphery of the coil lead 21 wound around the spool 18 of the core 10, and is heated at 150° C. for 10 minutes to form the exterior resin 25, and the loop type coil part 20 of the embodiment is obtained.

Figure 5:
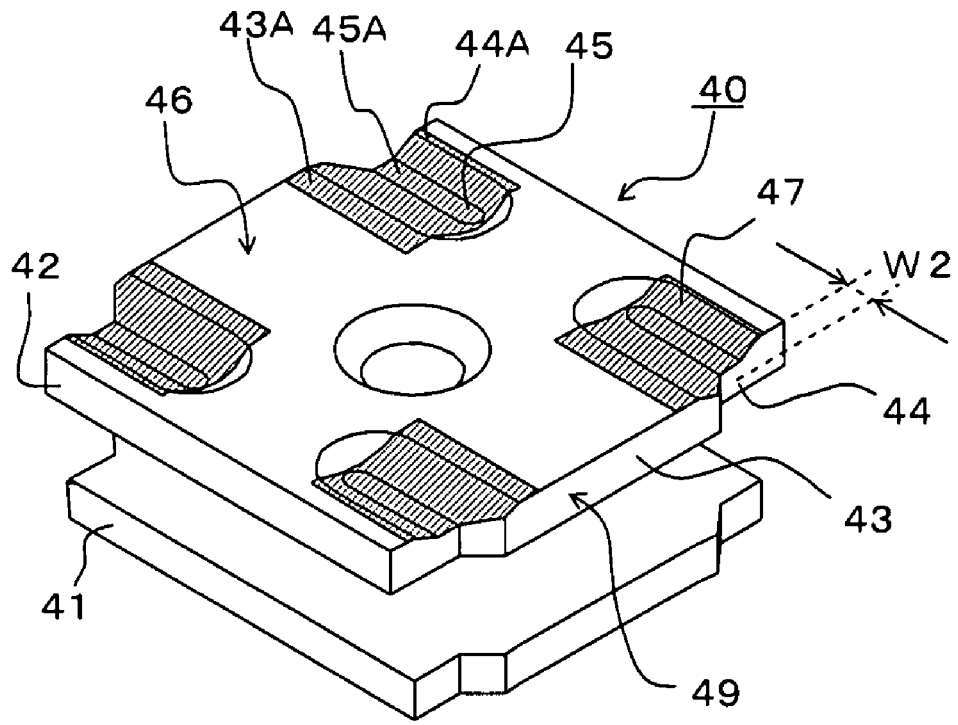
FIG. 5 is an outer appearance perspective view for explaining a drum type core used in a first modified example of the loop type coil part.

Next, a first modified example of the embodiment of the invention will be described with reference to FIG. 5. FIG. 5 is an outer appearance perspective view showing a drum type core 40 used in the first modified example of the loop type coil part. Since the outer appearance of the loop type coil part of the first modified example is almost the same as that of the loop type coil part of the first embodiment, its description will be omitted. A different point between the loop type coil part of the first modified example and the loop type coil part of the first embodiment is that the core used for the loop type coil part of the first modified example includes a spool arranged vertically to a mounting side and a plate-like flange 42 provided at an end of the spool to come in contact with the mounting side, a protruding part 43 is provided at a part of a side surface 49 of the flange 42 of the core 40 in the length direction, four recesses 45 are formed in a bottom surface 46 of the flange 42 so that each of them is in contact with the protruding part 43 of the side surface 49 of the flange 42 and a non-protruding part 44 adjacent to the protruding part 43, and a terminal electrode 47 continuous across an inner wall surface 45A adjacent to at least the side surface 49 of each of the four recesses 45, a bottom surface 43A of the protruding part 43 and a bottom surface 44A of the non-protruding part 44 is provided.

Thus, the loop type coil part using the drum type core 40 of this modified example can be provided with windings of two circuits, and can be used for use of a transformer, a common mode choking coil or the like.

Since the other structure and operation and effect are similar to those of the first embodiment, their description will be omitted.

Figure 6:
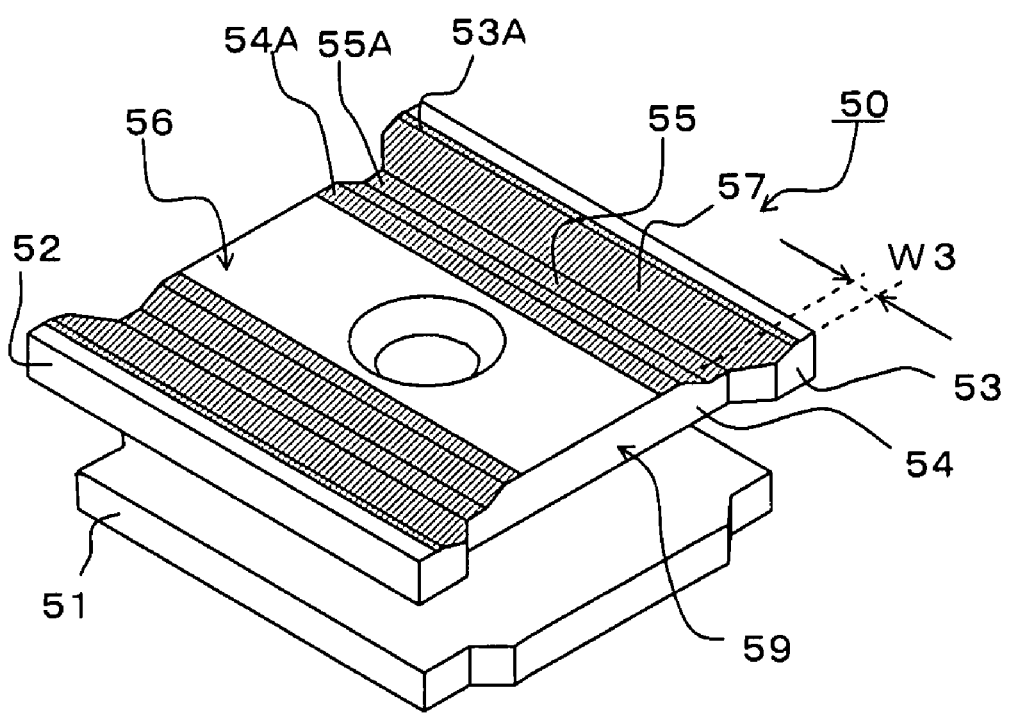
FIG. 6 is an outer appearance perspective view for explaining a drum type core used in a second modified example of the loop type coil part.
Figure 7:
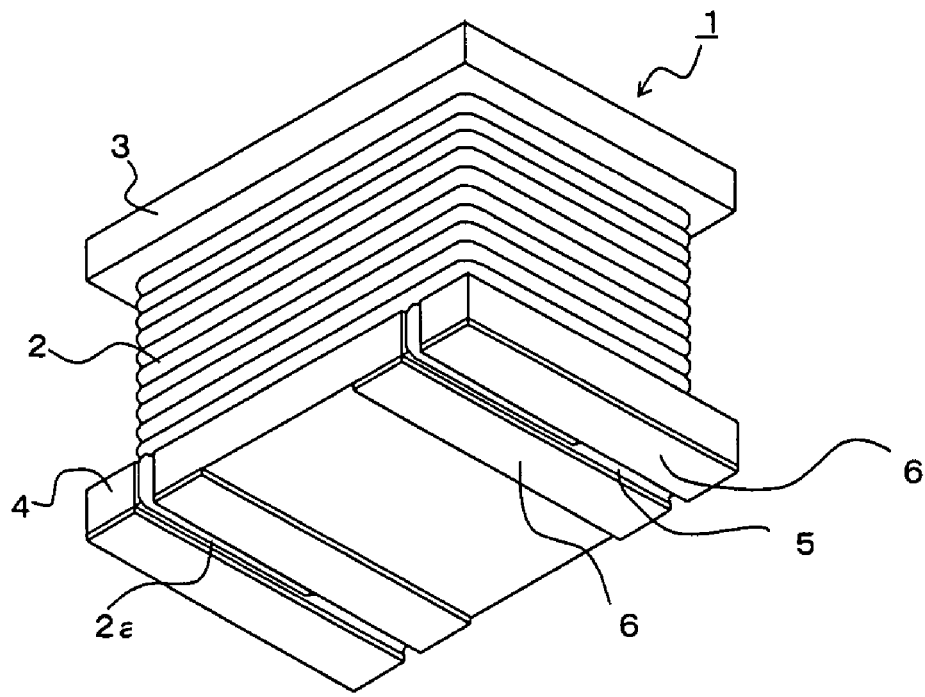
FIG. 7 is an outer appearance perspective view showing an example of the related art.
Figure 8:
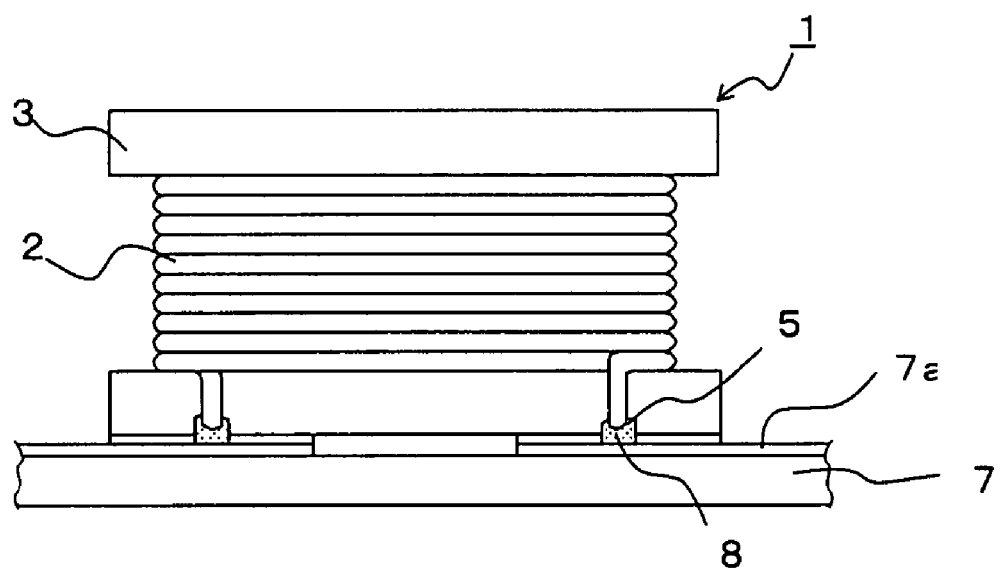
FIG. 8 is a side view for explaining a mounting state of the related art.

Next, a second modified example of the embodiment will be described with reference to FIG. 6. FIG. 6 is an outer appearance perspective view showing a drum type core 50 used in the second modified example of the loop type coil part. A description on the whole structure and outer appearance of the loop type coil part of the second modified example will be omitted. In the drum type core 50 used in the loop type coil part of the second modified example, a protruding part 53 is provided at each of both ends of a side surface of a flange 52 to come in contact with a mounting side of a circuit board in a length direction, two recesses 55 are formed in a bottom surface 56 of the flange 52 so that each of which is in contact with the protruding part 53 of a side surface 59 of the flange 52 and a non-protruding part 54 adjacent to the protruding part 53, and a terminal electrode 57 continuous across an inner wall surface 55A of the recess 55 adjacent to at least the side surface 59, a bottom surface 53A of the protruding part 53, and a bottom surface 54A of the non-protruding part 54 is provided.

In the loop type coil part of the second modified example, since the drum type core 50 is used, unlike the first embodiment, the fillet is not formed toward direction of four corners of the flange, and a merit that confirmation from the outer periphery is easy can not be obtained. However, since a pair of fillets is formed from the protruding part 53 to the center side of the flange 52 in the length direction, it becomes easy to confirm the two fillets at the same time from the side surface 59 direction.

Since the other structure and operation and effect are similar to those of the first embodiment, their description will be omitted.

These embodiments are suitably applicable to low back type loop type coil parts in which the fillet to facilitate confirmation of the quality of soldering can be formed.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A loop type coil part comprising:
  a core comprising a spool arranged vertically to a mounting side and a flange provided at an end of the spool in contact with the mounting side;
  a coil lead wound around the spool;
  a terminal electrode on a bottom surface of the flange and to which an end of the coil lead is soldered and fixed,
  a protruding part at a part of a side surface of the flange in a length direction, and
  a recess in the bottom surface of the flange intersecting the protruding pan and a non-protruding part adjacent to the protruding part,
  wherein the terminal electrode extends across an inner wall surface of the recess adjacent to at least the side surface, a bottom surface of the protruding part, and a bottom surface of the non-protruding part.

2. The loop type coil part according to claim 1, wherein the protruding part is provided at the center of the side surface of the flange in the length direction, and the terminal electrode is provided from the bottom surface of the protruding part to the bottom surface of the non-protruding part at each of both sides thereof.

3. The loop type coil part according to claim 1, wherein the protrusion size of the protruding part relative to the non-protruding part is larger than the depth of the recess.

4. The loop type coil part according to claim 1, wherein the protrusion size of the protruding part relative to the non-protruding part is larger than the diameter of a wire rod of the coil lead.

* * * * *